(12) United States Patent
Nakabayshi et al.

(10) Patent No.: US 6,979,650 B2
(45) Date of Patent: Dec. 27, 2005

(54) FABRICATION METHOD OF SEMICONDUCTOR INTEGRATED CIRCUIT DEVICE

(75) Inventors: Shinichi Nakabayshi, Hitachinaka (JP); Hisahiko Abe, Tokyo (JP); Hirofumi Tsuchiyama, Hitachinaka (JP); Masaki Hiyama, Yokohama (JP); Takashi Nishiguchi, Hitachinaka (JP)

(73) Assignee: Renesas Technology Corp., Tokyo (JP)

( * ) Notice: Subject to any disclaimer, the term of this patent is extended or adjusted under 35 U.S.C. 154(b) by 4 days.

(21) Appl. No.: 10/883,754

(22) Filed: Jul. 6, 2004

(65) Prior Publication Data

US 2004/0248418 A1 Dec. 9, 2004

Related U.S. Application Data

(63) Continuation of application No. 10/091,489, filed on Mar. 7, 2002, now abandoned.

(30) Foreign Application Priority Data

Apr. 19, 2001 (JP) .............................. 2001-121642

(51) Int. Cl.⁷ ............................................ H01L 21/461
(52) U.S. Cl. ........................ 438/692; 438/639; 438/691
(58) Field of Search ................................ 438/682–693

(56) References Cited

U.S. PATENT DOCUMENTS

| | | |
|---|---|---|
| 4,944,836 A | 7/1990 | Beyer et al. |
| 5,769,689 A | 6/1998 | Cossaboon et al. |
| 5,904,159 A | 5/1999 | Kato et al. |
| 5,916,855 A | 6/1999 | Avanzino et al. |
| 5,934,978 A | 8/1999 | Burke et al. |
| 5,954,997 A | 9/1999 | Kaufman et al. |
| 6,080,673 A | 6/2000 | Ko et al. |
| 6,114,249 A | 9/2000 | Canaperi et al. |
| 6,120,571 A | 9/2000 | Aihara et al. |
| 6,376,345 B1 | 4/2002 | Ohashi et al. |
| 6,514,864 B2 | 2/2003 | Nakabayashi et al. |

FOREIGN PATENT DOCUMENTS

| | | |
|---|---|---|
| JP | 8-257898 | 10/1996 |
| JP | 10-193255 | 7/1998 |
| JP | 10-321588 | 12/1998 |
| JP | 11-246852 | 9/1999 |

*Primary Examiner*—Dung A. Le
(74) *Attorney, Agent, or Firm*—Antonelli, Terry, Stout and Kraus, LLP.

(57) ABSTRACT

In order to reduce micro scratches which tend to occur during chemical-mechanical polishing, a polishing slurry is diluted with deionized water immediately before it is supplied in a gap between a polishing pad and the surface of a wafer to be polished. By diluting the polishing slurry with deionized water to increase its volume, the concentration of coagulated particles contained in the polishing slurry can be lowered. For a mixture ratio of the polishing slurry and deionized water, about 1 (polishing slurry): 1–1.2 (deionized water) is used, and the concentration of silica contained in the diluted polishing slurry is adjusted to about 3–9 weight %, preferably about 4–8 weight %, and more preferably about 8 weight %.

12 Claims, 13 Drawing Sheets

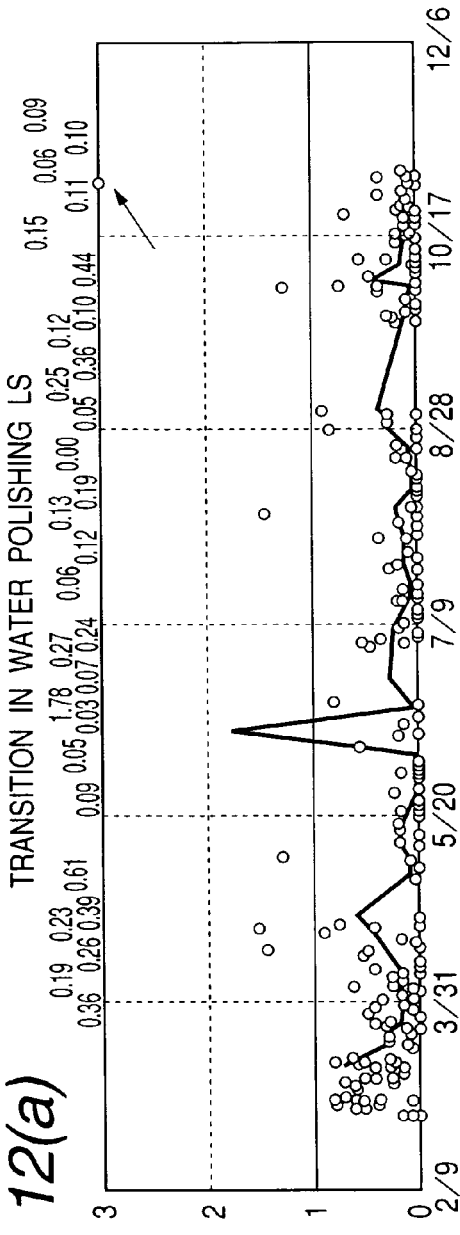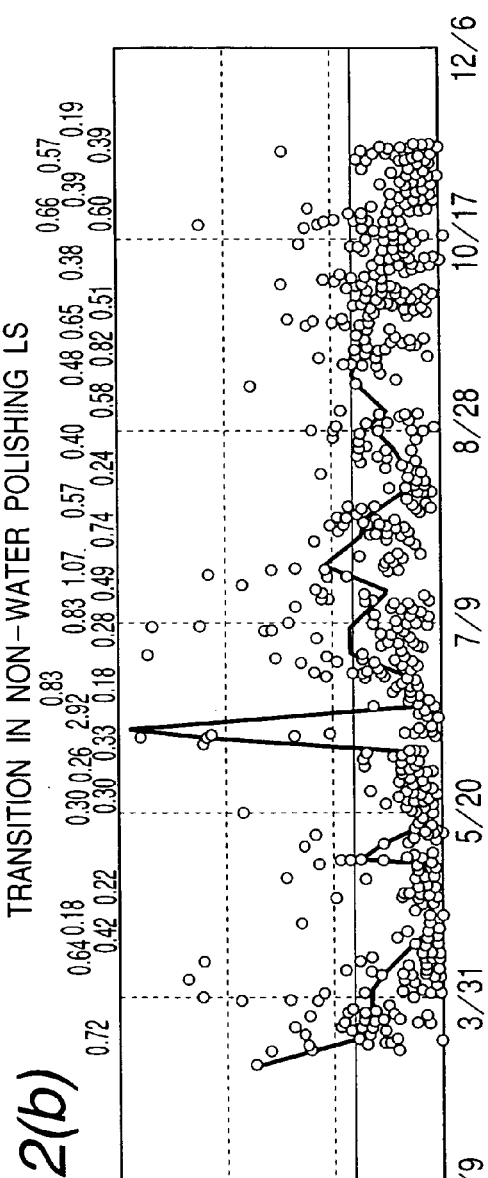
FIG. 12(a) TRANSITION IN WATER POLISHING LS
FIG. 12(b) TRANSITION IN NON-WATER POLISHING LS

FABRICATION METHOD OF SEMICONDUCTOR INTEGRATED CIRCUIT DEVICE

This application is a Continuation application of prior application Ser. No. 10/091,489, filed Mar. 7, 2002 now abandoned, the contents of which are incorporated herein by reference in their entirety.

BACKGROUND OF THE INVENTION

The present invention relates to a method of fabrication of a semiconductor integrated circuit device; and, more particularly, the invention relates to technology for fabrication of semiconductor integrated circuit devices, including a step of polishing a thin film deposited on the surface of a semiconductor wafer by chemical-mechanical polishing (CMP).

One example of micro-fabrication technologies, which represent an important aspect in the packaging of integrated circuits on semiconductors at higher densities and in enhancing their performance, is the chemical-mechanical polishing method that is used for formation of grooves that provide isolation between elements, referred to as Shallow Groove Isolation (SGI), for planarization of interlayer dielectrics in a multilayer wiring formation step, and for formation of embedded metal wiring. This chemical-mechanical polishing technology is described, for example, in the U.S. Pat. No. 4,944,836.

The chemical-mechanical polishing method is characterized by the fact that the surface of a wafer is polished while a polishing slurry is supplied on a turntable on which a polishing pad made of hard resin is attached. A particulate abrasive, such as silica (silicon oxide), is used for the polishing slurry, which is formed by dispersing the abrasive in deionized water and adding an alkaline substance for pH control. However, a problem has been recognized in that micro scratches may occur on the wafer surface due to the presence of coagulated coarse particles in the slurry, when the wafer is being polished with a polishing slurry containing silica, causing a deterioration in the LSI manufacturing yield rate and reliability.

In Japanese Unexamined Patent Publication No. Hei 10(1998)-321588 (Kou et al.), a method is disclosed for preventing micro scratches from occurring on the wafer surface due to the presence of coagulated particles. According to the technique disclosed in this Publication, generally, in the chemical-mechanical step, deionized water is supplied on the polishing pad to maintain a continuously wet condition. In the polishing step, the polishing slurry is supplied on a polishing pad moistened with deionized water. However, the pH value of the polishing slurry containing silica is about 10–11, while the pH value of purified water is 7. For this reason, when the polishing slurry is supplied on a polishing pad moistened with deionized water, a large difference in the pH value between the polishing slurry and the deionized water causes coarse coagulated particles to be created in the polishing slurry, leading to micro scratches on the wafer surface.

To solve this problem, as described in the above-mentioned Publication, a method has been proposed in which the polishing pad is moistened with pH pre-adjusted deionized water so that its pH value is identical to that of the polishing slurry, and then the polishing slurry is supplied on the polishing pad. In addition, another method has been proposed in which a mixture of pH pre-adjusted deionized water and a polishing slurry mixed at a given ratio is prepared for application to the polishing pad. When an alkaline substance is used for the polishing slurry, an alkaline reagent should be used for the pH adjustment reagent; while, when an acid substance is used for the polishing slurry, an acid reagent should be used for the pH adjustment reagent. If the alkaline polishing slurry containing silica is used, KOH or $NH_4OH$ may be preferably used for the pH adjustment reagent.

SUMMARY OF THE INVENTION

Recently, to facilitate micro-fabrication of LSI elements and multilayer wiring, the chemical-mechanical polishing method has been applied in several steps of the wafer fabrication process. For example, in the step of forming an element isolating groove, dry-etching is applied to the primary surface of the wafer, using a oxidation-resistant film as a mask, to form a groove in the element isolating region; a silicon oxide film with a thickness larger than the depth of the groove is deposited on the primary surface of the wafer, including the inside of the groove; chemical-mechanical polishing is applied to the silicon oxide film using the oxidation-resistant insulating film as a stopper against polishing; and then the silicon oxide film is selectively left inside the groove to form an element isolating groove.

In the above-mentioned chemical-mechanical polishing step, generally, a polishing slurry having silica particles dispersed in water is used. Since hydrophilic Si—OH groups exist on the surfaces of silica particles, inter-particle hydrogen bonding in the Si—OH group and the van der Waals force cause primary particles to coagulate with each other when silica particles are dispersed in water, forming coagulated particles (secondary particles) with a diameter larger than that of a single particle. Accordingly, in the polishing slurry having silica particles (dispersoid) dispersed in water (Dispersion medium), an abrasive component is composed of these coagulated particles.

If their diameter is rather small, the coagulated particles create no problem. However, in the actual polishing slurry, coarse coagulated particles with a diameter of 1 $\mu$m or larger (in this application, coagulated particles with a diameter of 1 $\mu$m or larger are referred to as "coarse coagulated particles") exist and cause minute scratches called "micro scratches" to occur on the wafer surface, leading to a deterioration in the yield rate or reliability. For example, in the above-mentioned step of forming element isolating grooves, if micro scratches occur on the surface of the oxidization-resistance insulating film, while chemical-mechanical polishing is applied to the silicon oxide film using the oxidation-resistant insulation film as a stopper against polishing, some of the micro scratches may reach an underlying silicon substrate, causing damage to the substrate surface.

Although filtration of the polishing slurry is useful to some extent for removing the coarse coagulated particles in the polishing slurry, coagulated particles begin to re-coagulate in the polishing slurry if it is left as it is after the coarse particles are removed, which means that this method is not an effective solution to the problem.

In this context, the inventor et al. has proposed a method to prevent micro scratches from occurring on the wafer surface due to the presence of the coagulated particles by taking steps in advance (Patent Application No. 2000-145379). In this method, prior to the chemical-mechanical polishing step in which the polishing slurry is applied on the wafer surface to be processed, the polishing slurry is left at rest for a given period to reduce the concentration of coagulated silica particles with a diameter of 1 μm or larger contained in the polishing slurry to below 200,000/0.5 cc, preferably to 50,000/0.5 cc, and more preferably to 20,000/0.5 cc.

The above-mentioned method proposed by the inventors can very efficiently reduce the concentration of coarse coagulated silica particles contained in the polishing slurry. However, since the still-standing period is not always fixed in duration due to a difference in manufacturing lot of the polishing slurry, it can not be expected that this method will reduce the concentration of coarse coagulated particles sufficiently, if it is used exclusively.

An object of the present invention is to provide a reduction in density of coagulated particles contained in the polishing slurry to be used in a chemical-mechanical polishing step.

Another object of the present invention is to provide a chemical-mechanical polishing technique which produces a reduction in the occurrence of micro scratches.

Another object of the present invention is to provide a technique which can prevent a reduction in the yield rate and the reliability of an integrated circuit device caused by micro scratches occurring in chemical-mechanical polishing step.

The above-mentioned and other objects and novel characteristics will become more apparent from the following detailed descriptions provided in the present specification and from the attached drawings.

Out of the aspects of the present invention to be disclosed in this application, typical ones are briefly explained below.

A method of fabrication of a semiconductor integrated circuit device comprises the steps of: (a) preparing a polishing slurry in the stable particle dispersion state; (b) diluting the polishing slurry with a water solution, which has deionized water as a main component; and (c) supplying the polishing slurry on the surface of the wafer undergoing a mass-production process immediately after being diluted with the water solution to carry out the chemical-mechanical polishing method.

Note that, in this application, chemical-mechanical polishing (CMP) is a method, in which, generally, wafers are moved in opposite directions during polishing, while the polishing slurry is supplied with the wafer surface to be polished in contact with a polishing pad made of a sheet material, such as a soft cloth.

The polishing slurry is a fluid-colloidal suspension, in which, generally, abrasive particles (dispersion medium) are mixed in water and a chemical etching agent (dispersoid). The abrasive particles generally include silica, ceria, zirconia, and alumina.

The insulating film isolating groove, that is formed by polishing for smoothing, is an element isolating groove, which is formed by selectively leaving the insulating film, the surface of which is smoothed by chemical-mechanical polishing, inside the groove. Accordingly, the element-isolating grove, which is formed simply by depositing the insulating film inside the groove, is not adequate for the insulating film groove smoothed by polishing given here. For example, the element-isolating groove commonly referred to as Shallow Groove Isolation (SGI) or Shallow Trench Isolation (STI) is adequate for the purpose.

Deionized water includes not only "deionized water" as used in the semiconductor fabricating process, but also water solutions and chemical solutions containing deionized water as a main component.

In this application, the mass-production process on the wafer line is a process, in which the throughput/day for the specific chemical-mechanical polishing system used on the wafer line is at least 25 or more, or 50 or more, 8/inch wafers, and more generally 100 wafers or more. Note that, it goes without saying, this critical number of wafers is inversely proportional to the wafer areas.

In the following description of the embodiments, if necessary for convenience, members will be explained as being included in more than one section or embodiment, however, they are not independent of each other, unless specified otherwise, and one partially or completely explains the example of another mode, detail, and supplement of the other.

In addition, in the following embodiments, when a number of members (including number of units, values, quantities, ranges, etc.) is referred to, the invention is not limited to the given number, and the number may be above or lower than the specified number except in a case where the number is specifically defined or it is clear that the number is limited to the specific number in principle. In addition, in the following embodiments, it goes without saying that the components (including the number of component steps) are not always required except in a case where they are especially specified or it is clear that they are required in principle.

Similarly, in the following embodiments, when the shapes and relative positions of the members are referred to, they may include those substantially close to or similar to the specified shapes and relative positions except in a case where they are especially specified or where it is clear that they are not correct in principle. This is applicable as well to the above-mentioned values and ranges.

In this application, when a semiconductor integrated circuit device is referred to, it may include not only those specially fabricated on a monocrystal silicon substrate, but also those fabricated on other substrates such, as a Silicon On Insulator (SOI) substrate and Thin Film Transistor (TFT) substrate for manufacturing a liquid crystal device. Moreover, the wafer may be a monocrystal silicon substrate (usually, almost disk-shape), SOI substrate, glass substrate, other insulation substrate, semi-insulation substrate, semiconductor substrate or a combination thereof.

BRIEF DESCRIPTION OF THE DRAWINGS

FIG. 12(a) and FIG. 12(b) are graphs showing the results of evaluating the relationship between the scratch defect density and the polishing slurry concentration.

PREFERRED EMBODIMENTS OF THE INVENTION

Figure 1:
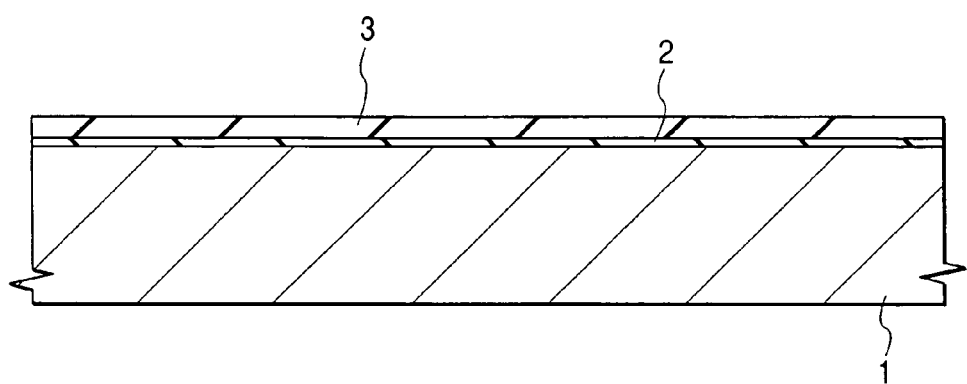
FIG. 1 is a sectional view of a silicon substrate showing a step in the method of fabricating a semiconductor integrated circuit device according to one embodiment of the present invention.

An embodiment of the present invention will be explained in detail based on the accompanying drawings. Note that in all of the drawings used to explain the embodiments, the same reference numerals are assigned to the same members, and repeated explanation thereof is omitted.

Embodiment 1

A method of fabrication of a Dynamic Random Access Memory (DRAM), which represents embodiment 1 of the present invention, will be explained as a sequence of steps with reference to FIG. 1–FIG. 22.

First, as shown in FIG. 1, a wafer 1 made of p-type monocrystal silicon with a resistivity, for example, of 1–10 $\Omega$cm is heat-oxidized at a temperature of about 850° C., and on its surface, a thin silicon oxide film 2 with a thickness of about 10 nm is formed. Then, on the top of the silicon oxide film 2, a silicon nitride film (oxidation-resistant film) 3 with a thickness of about 120 nm is deposited by the CVD method.

The silicon nitride film 3 is used as a mask when a groove is formed by etching the substrate 1 in an element-isolating region. In addition, the silicon nitride film 3 is used as a mask which prevents the surface of the underlying substrate 1 from being oxidized, because it has a characteristic that makes it difficult to be oxidized. The silicon oxide film 2 under the silicon nitride film 3 is formed so that a stress exerted on an interface between the substrate 1 and the silicon nitride film 3 is relieved to prevent any fault, such as displacement, from occurring due to the stress on the surface of the substrate 1.

Figure 2:
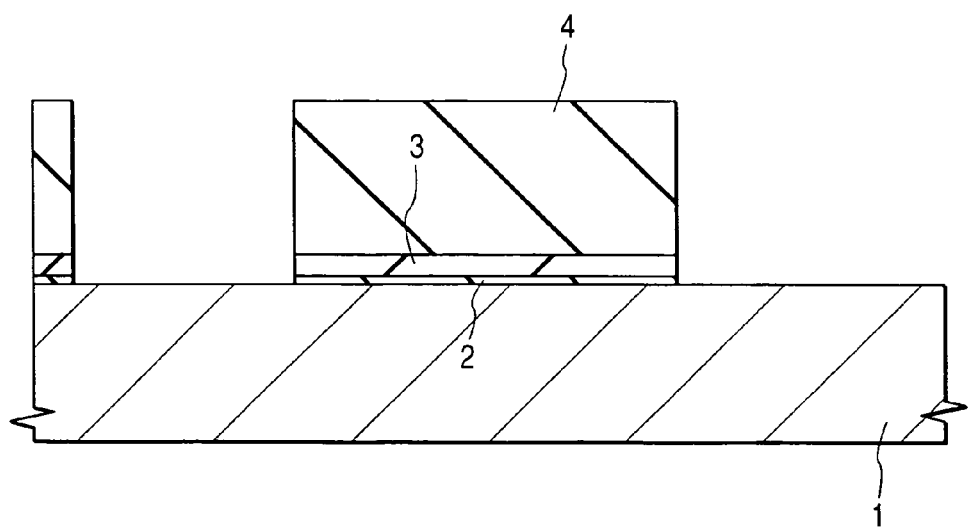
FIG. 2 is a sectional view of the silicon substrate showing a subsequent step in the method for fabricating a semiconductor integrated circuit device according to one embodiment of the present invention.
Figure 3:
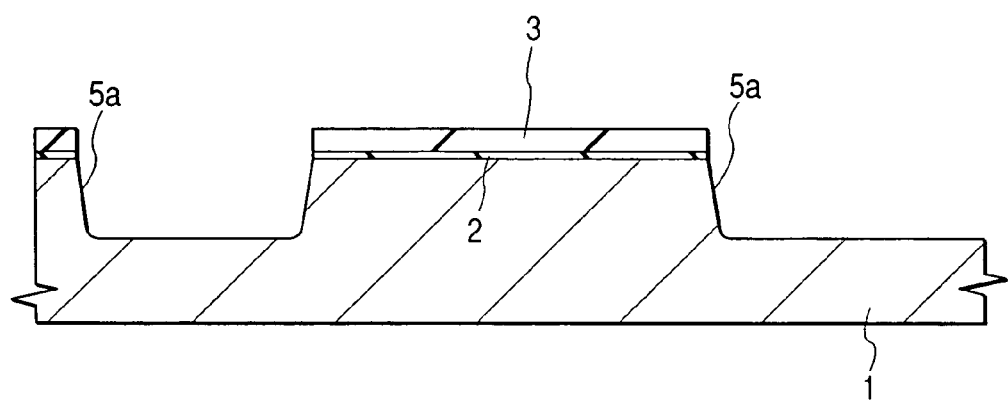
FIG. 3 is a sectional view of the silicon substrate showing a subsequent step in the method of fabricating a semiconductor integrated circuit device according to one embodiment of the present invention.

Next, as shown in FIG. 2, the silicon nitride film 3 and the underlying silicon oxide film 2 are selectively removed from the element-isolating region by dry-etching using a photo-resist 4 as a mask, and then, after the photo-resist film 4 is removed, as shown in FIG. 3, a groove 5a with a depth of about 350 nm is formed on the substrate 1 in the element isolating region by dry-etching using the silicon nitride film 3 as a mask.

Figure 4:
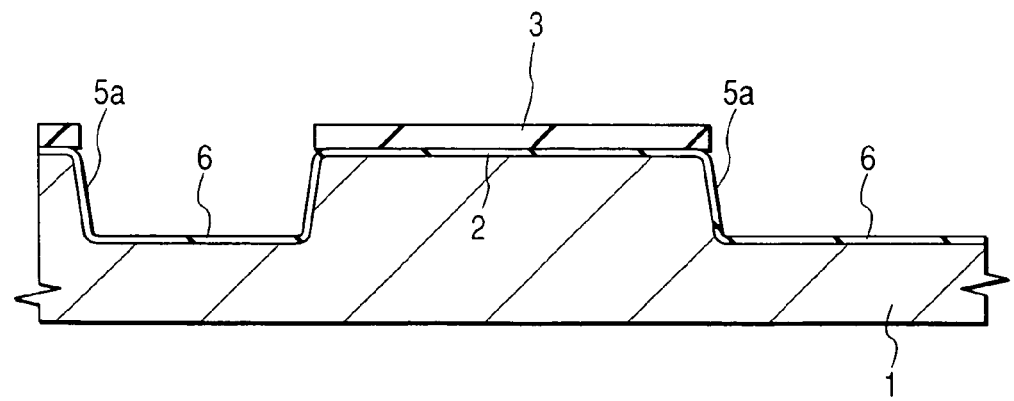
FIG. 4 is a sectional view of the silicon substrate showing a subsequent step in the method of fabricating a semiconductor integrated circuit device according to one embodiment of the present invention.

Next, as shown in FIG. 4, the substrate 1 is heat oxidized at a temperature of about 800–1000° C. to form a thin silicon oxide film 6 with a thickness of about 10 nm on the inner wall of the groove 5a. The silicon oxide film 6 is formed so that any damage inside the inner wall of the groove 5a caused by dry-etching can be recovered and a stress exerted on the interface between a silicon oxide film 7, which is embedded inside the groove 5a in a later step, and the substrate 1 can relieved.

Figure 5:
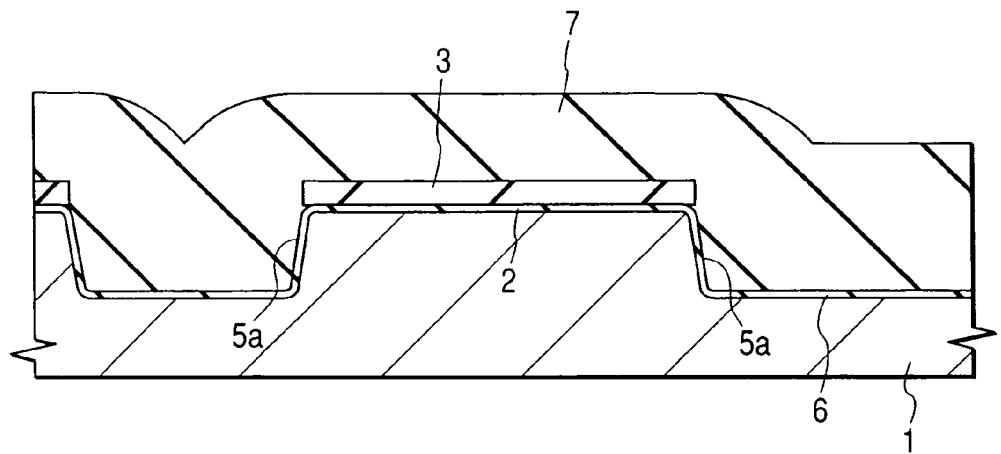
FIG. 5 is a sectional view of the silicon substrate showing a subsequent step in the method of fabricating a semiconductor integrated circuit device according to one embodiment of the present invention.

Next, as shown in FIG. 5, the silicon oxide film 7 is deposited on the substrate 1, including the inside of the grove 5a, by the CVD method. The silicon oxide film 7 is deposited at a thickness larger than the depth of the groove 5a (for example, about 500–600 nm) to embed the silicon oxide film 7 inside the groove 5a with no gap. The silicon oxide film 7 should be composed of a film with a high level of step coverage, for example, a silicon oxide film (hereafter, simply referred to as P-TEOS) formed by the plasma CDV method using oxygen and $(C_2H_5)_4Si$.

Figure 6:
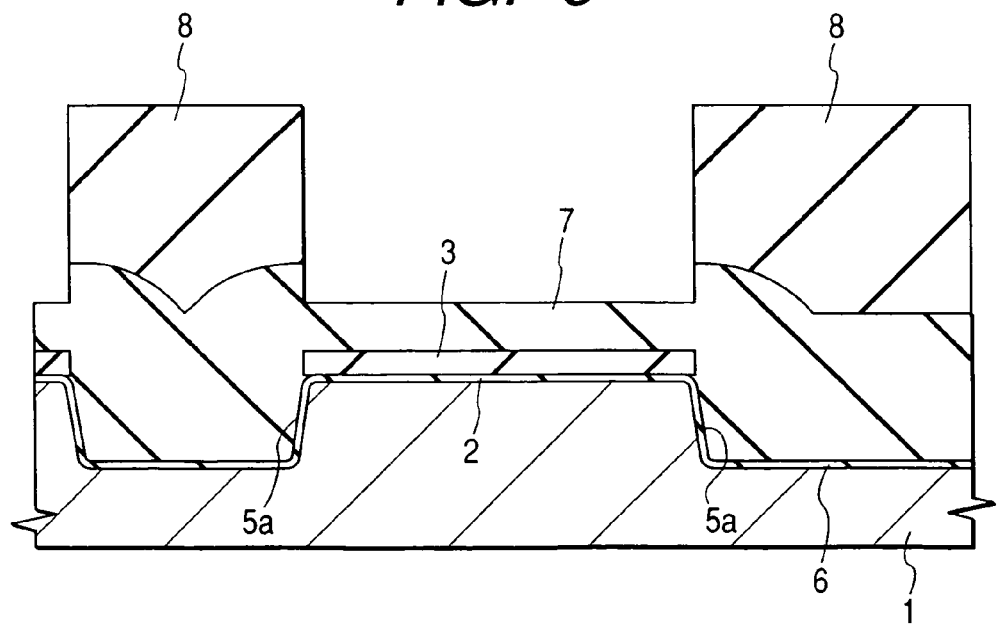
FIG. 6 is a sectional view of the silicon substrate showing a subsequent step in the method of fabricating a semiconductor integrated circuit device according to one embodiment of the present invention.

Next, after the substrate 1 is heat oxidized at a temperature of about 1000° C. to densify for improving the quality of the silicon oxide film 7 embedded inside the groove 5a, as shown in FIG. 6, the silicon oxide film 7 on the silicon nitride film 3 is dry-etched using the photo-resist 8 formed on the groove 5a as a mask. This application of dry etching is intended to make the height of the surface of the silicon oxide film 7 almost identical both on the groove 5a and on the silicon nitride film 3.

Figure 7:
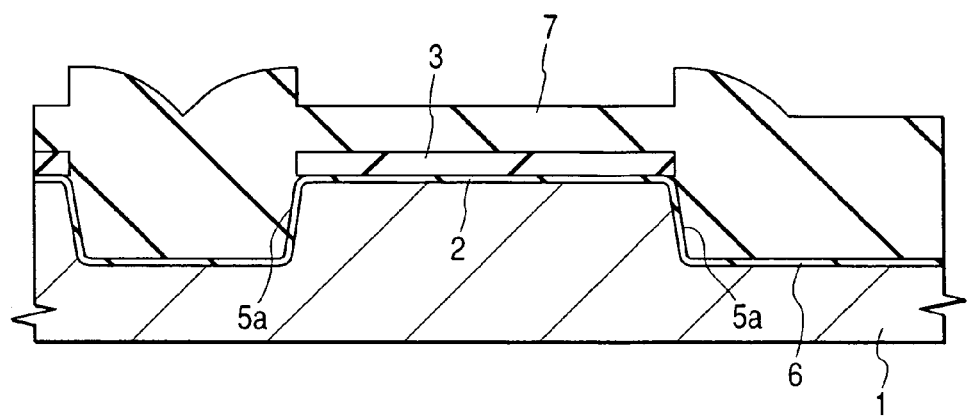
FIG. 7 is a sectional view of the silicon substrate showing a subsequent step in the method of fabricating a semiconductor integrated circuit device according to one embodiment of the present invention.

Next, as shown in FIG. 7, after the photo-resist film 8 on the silicon oxide film 7 is removed, chemical-mechanical polishing is applied to the silicon oxide film 7 by the following method.

Figure 8:
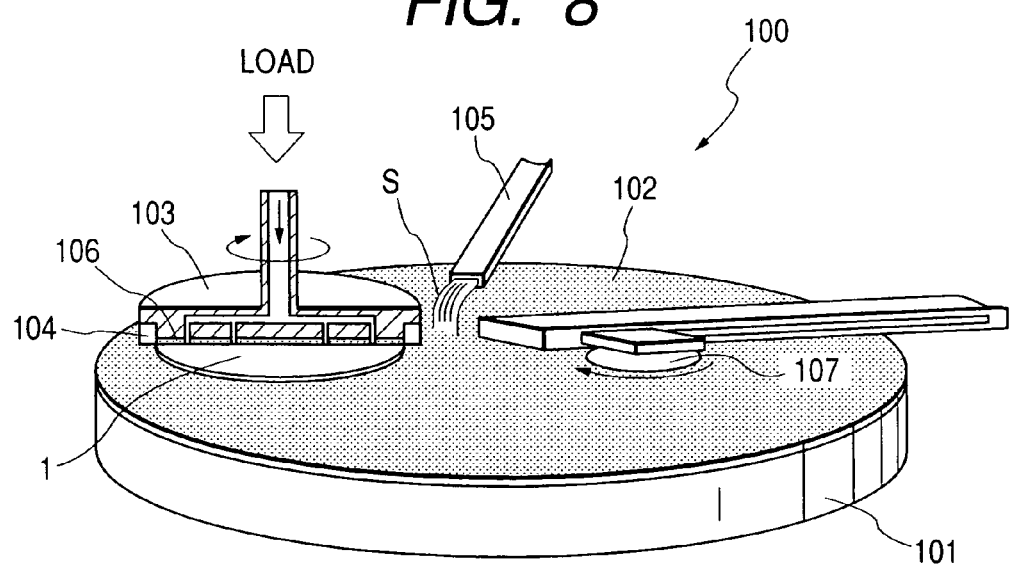
FIG. 8 is a diagram showing in perspective a processing part of a chemical mechanical polishing system, which is used to chemo-mechanically polish silicon oxide films.

FIG. 8 is a schematic drawing showing a processing part of the chemical-mechanical polishing system 100 used for polishing the silicon oxide film 7. As seen from the figure, a turntable 101 is disposed at the processing part of the chemical-mechanical polishing system 100 for polishing the wafer (substrate) 1 using the single wafer polishing method.

The turntable 101 is rotationally driven in the horizontal plane by a driving mechanism (not shown). In addition, on the top of the turntable 101, a polishing pad 102 made of porous synthetic resin, such as polyurethane, is attached.

Above the turntable 101, a wafer carrier 103 is disposed, which is rotationally driven in up and down directions and in the horizontal plane by a driving mechanism (not shown). The wafer 1 is supported, with its primary surface (surface to be polished) facing down, by a retainer ring 104 and a membrane 106 disposed under the wafer carrier 103, so that the wafer is pressed against the polishing pad 102 under a given pressure. Between the surface of the polishing pads 102 and the surface of the wafer 1, a polishing slurry S is supplied through a slurry transportation tube 105 so that the surface to be polished on the wafer 1 is chemically and mechanically polished.

Moreover, above the turntable 101, a dresser 107 is disposed, which is rotationally driven in up and down directions and in the horizontal plane by a driving mechanism (not shown). At the bottom of the dresser 107, a backing material is disposed, on which diamond particles are electrodeposited so as to cut the surface of the polishing pad 102 regularly to prevent clogging due to abrasive particles.

The polishing slurry S used in the embodiment is prepared by dispersing fumed silica, which is an abrasive particle component, in water and adding $NH_4OH$ to adjust its pH value. The polishing slurry S, after its components are adjusted in accordance with the following method, is supplied to a gap between the surface of the polishing pad 102 and the surface to be polished of the wafer 1.

First, the polishing slurry S is prepared, the silica concentration of which has been adjusted so that silica dispersed in water might keep most stable. Especially, the polishing slurry is prepared so that it contains 11–15 weight %, preferably 11–13 weight %; and more preferably 12 weight %, of silica, and its pH is kept about a value 11 (100.5–11.5) by adding $NH_4OH$.

Among the commercially available polishing slurry products, some products have a silica concentration adjusted within the tolerance above-mentioned, and they may be used. Note that the commercially available slurry products contain coarse coagulated particles with a diameter of 1 μm or larger and foreign matter, which tend to cause micro scratches, which is the problem to be solved by the present invention. Accordingly, it is desirable that, when the polishing slurry S purchased from a slurry supplier is supplied to the chemical-mechanical polishing system 100, a filter is installed in a pipe connecting the tank containing the purchased slurry S and the chemical-mechanical polishing system 100 to sufficiently filter out the coarse coagulated particles and the foreign matter from the polishing slurry S.

In addition, to effectively restrain the occurrence of micro scratches, the polishing slurry S supplied to the chemical-mechanical polishing system 100 should be left at rest for 30 days or more, preferably 40 days or more, and more preferably 45 days or more, and used only after it is verified that the number of coarse coagulated particles with a diameter of 1 μm or larger contained in 0.5 cc of polishing slurry is below 200,000, preferably below 50,000, and more preferably below 20,000. Moreover, when the polishing slurry S, which was left at rest for the above-mentioned period, is transported from the tank into the chemical-mechanical polishing system 100, supernatant liquid should be skimmed from 5 cm or more above, and preferably 10 cm or more above, the bottom of the tank so as to not mix coarse coagulated articles and foreign matter deposited at the bottom of the tank.

Leaving the polishing slurry at rest means that the polishing slurry S filled up in the tank is left at rest with no operation, such as vibration, stirring and heating (involving material transportation on a convection). Note that the method for storing the polishing slurry S described here is explained in detail in the afore-mentioned Patent Application No. 2000-145379.

Next, in this embodiment, the polishing slurry S is diluted with deionized water. A mixture rate of 1 (polishing slurry): 1–1.2 (deionized water) is used so that the concentration of silica contained in the polishing slurry S after dilution is 3–9 weight %, preferably 4–8 weight %, and more preferably 8 weight %. Note that some of the commercially available polishing slurry products contain a high concentration of silica (for example, 25 weight %). If this type of polishing slurry S containing a high concentration of silica is used, the concentration of silica contained in the diluted polishing slurry is adjusted within the above-mentioned range by using a larger mixture rate of deionized water. Note that deionized water includes water solutions and chemical solutions mainly made of water, all of which are identified by the generic name "deionized water".

Thus, the concentration of coarse coagulated particles contained in the polishing slurry S is reduced by diluting the polishing slurry S with deionized water to increase its volume. Note that, if the dilution rate of the polishing slurry S is increased, the concentration of coarse coagulated particles further decreases, but it is preferable that the concentration of silica contained in the diluted polishing slurry S is at least 3 weight % or more because the polishing rate is reduced when the concentration of abrasive components in the polishing slurry S decreases.

In addition, when the polishing slurry S is diluted with deionized water, the concentration of coagulated particles temporarily decreases, and after the polishing slurry S is left at rest, silica particles begin to coagulate. Accordingly, the polishing slurry diluted with deionized water should be used for polishing as soon as possible. This means that dilution of the polishing slurry S is performed immediately before it is supplied in the gap between the polishing pad 102 and the surface to be polished of the wafer 1.

The time allowed for a period from dilution of the polishing slurry S with deionized water until application of the slurry to the polishing process is up to about two hours, and if this time period is exceeded, dilution ceases to be in effect because the concentration of coagulated particles returns to the level before dilution. Since re-coagulation of silica proceeds with time in the polishing slurry S, it is preferable that the time from dilution of the polishing slurry S until application of the slurry to the polishing process is shorter, and usually, it should be set to 10 minutes or less, and preferably to 10–15 seconds or less.

Figure 9:
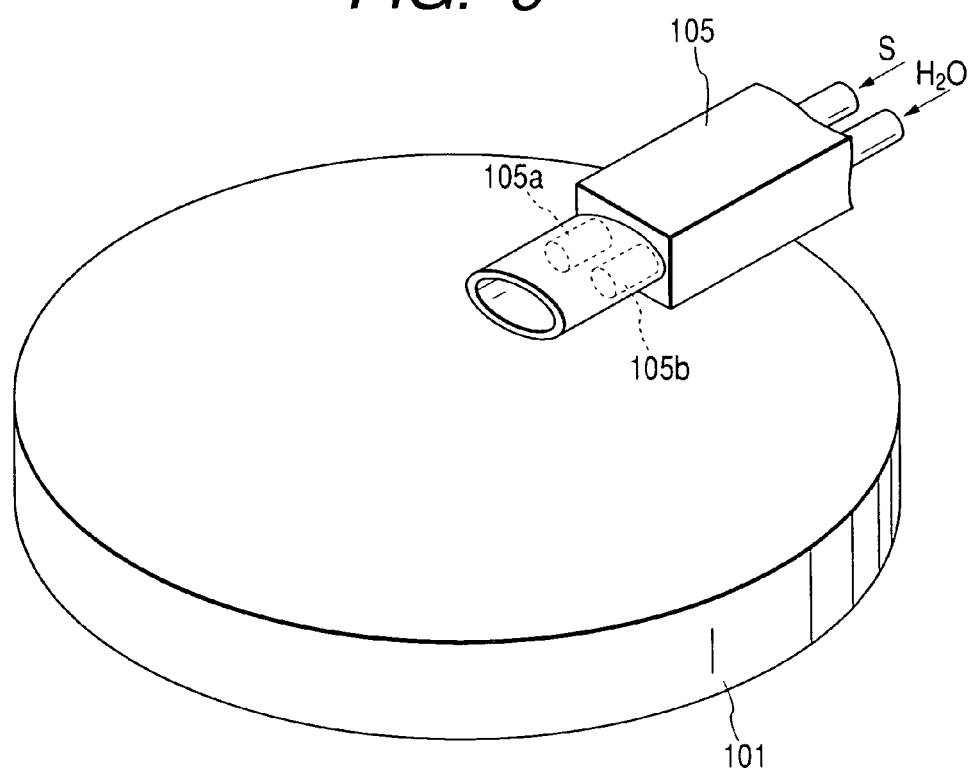
FIG. 9 is a diagram showing in perspective a slurry supply pipe of the chemical mechanical polishing system shown in FIG. 8.

For example, as shown in FIG. 9, the polishing slurry S diluted with deionized water can be rapidly supplied for polishing by disposing a piping 105a for supplying the polishing slurry and a piping 105b for supplying deionized water inside a slurry supply pipe so as to mix the polishing slurry S and deionized water at an end of the slurry supply pipe 105.

Alternately, a deionized water supply pipe may be disposed independently of the slurry supply pipe 105 on the polishing pad 102 to mix deionized water supplied from the deionized water supply pipe and the polishing slurry S supplied from the slurry supply pipe 105 on the surface of the polishing pad 102. Moreover, it may be possible that, after the polishing slurry S is supplied on the surface of the polishing pad 102, deionized water is supplied on the polishing pad 102 for mixing them. Note that, since the ratio between them partially loses its balance if the polishing slurry S and deionized water are mixed on the surface of the polishing pad 102, an imbalance may occur in the amount of polishing in the wafer plane.

After the substrates (wafers) 1 undergoing the mass-production process are transported to the processing part of the chemical-mechanical polishing system 100 one by one and are supported at the bottom of the wafer carrier 103, the silicon oxide film 7 deposited on the substrate is polished with the diluted polishing slurry S. The polishing conditions are set to, for example, load=250 g/cm2, wafer carrier revolutions=30 rpm, turn table revolutions=25 rpm, and slurry flow rate=200 cc/min.

Figure 10:
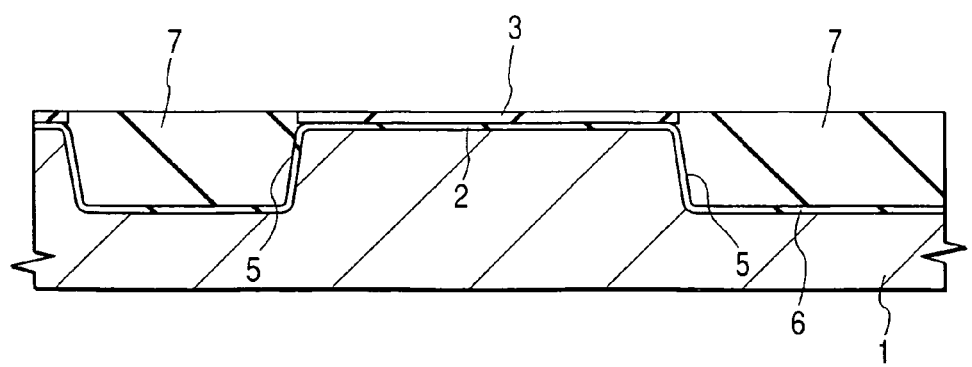
FIG. 10 is a sectional view of the silicon substrate showing a step in the method of fabricating a semiconductor integrated circuit device according to one embodiment of the present invention.

FIG. 10 shows a cross section of the substrate (wafer) 1 immediately after chemical-mechanical polishing has been applied to it. Polishing of the silicon oxide film 7 is performed using the silicon nitride film 3 as a stopper, and it is stopped when the thickness of the silicon nitride film 3 reaches 60 nm. This forms an element-isolating groove 5, in which the silicon oxide film 7 is embedded, in the element-isolating region of the primary surface of the substrate (wafer) 1.

The polished substrates (wafers) 1, after being taken out from the wafer carrier 103, are transported to cleaning equipment (not shown) connected to a subsequent stage of the chemical-mechanical polishing system 100 one by one, and silica abrasive particles and alkaline metal ions contained in the polishing slurry S are removed at this stage by deionized water cleaning, deionized water ultrasonic cleaning, deionized water flush cleaning, or deionized water spin cleaning. In addition, they are dried by any method, such as spin-drying or IPA (Isopropyl alcohol) vapor drying, and then they are transported to the next step. On the other hand, new substrates (wafers) 1, which have undergone the step shown in FIG. 7, are transported to the chemical-mechanical polishing system 100 one by one and the chemical-mechanical polishing step is repeated.

Figure 11:
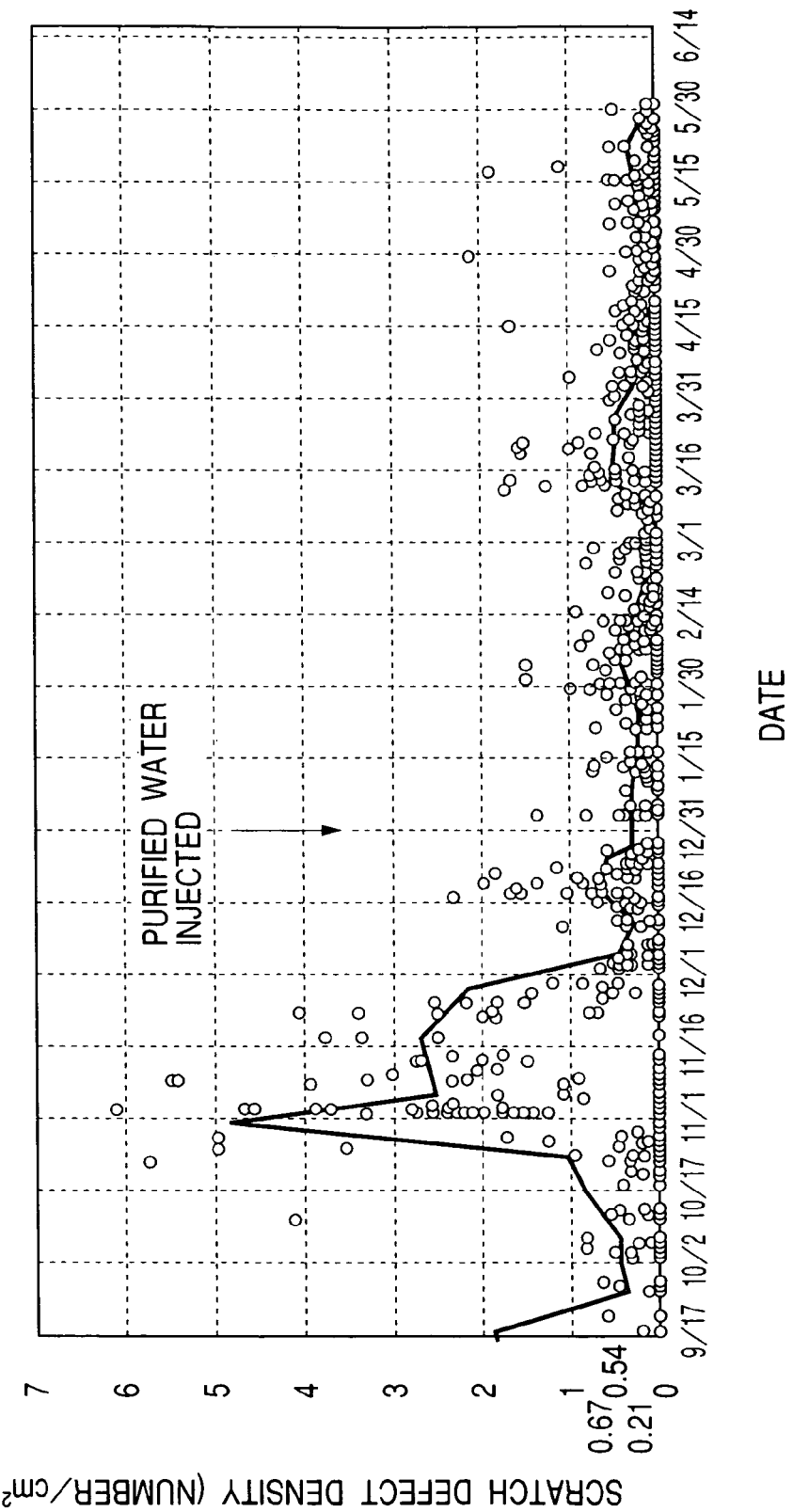
FIG. 11 is a graph showing the result of evaluating the relationship between a scratch defect density and a polishing slurry concentration.

FIG. 11 is a graph showing the comparison of the defect density values of scratches on the surfaces of the wafers 1 occurring in the step for forming the element isolating groove between the case where the polishing slurry (silica concentration=6 weight %) diluted with deionized water is used and the case where the undiluted polishing slurry (silica concentration 12 weight %) is used. The vertical axis indicates the scratch defect density values measured using automatic wafer visual inspection equipment (WI-800) from Hitachi Tokyo Electronics and the horizontal axis denotes inspection dates. As shown in the figure, the scratch defect density values are undoubtedly smaller on the day when the polishing slurry diluted with deionized water was used or later than those produced before that day.

FIG. 12 is a graph showing the comparison of the numbers of macro scratches between the case where the polishing slurry (silica concentration=6 weight %) diluted with deionized water is used on the primary surface of a mirror wafer, on which a silicon oxide film was deposited by the plasma CVD method, (FIG. 12(*a*)) and the case where the undiluted polishing slurry (silica concentration=12 weight %) is used (FIG. 12(*b*)). The number of micro scratches was measured using visual inspection equipment (LS-6510) from Hitachi DECO. As shown in the figure, the number of micro scratches is clearly smaller in the case of wafers polished using the polishing slurry diluted with deionized water than that of wafers using the undiluted polishing slurry.

Figure 13:
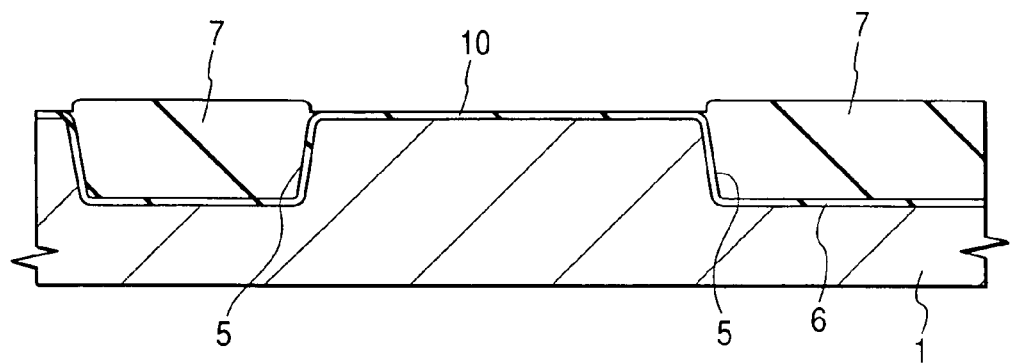
FIG. 13 is a sectional view of the silicon substrate showing a step in the method of fabricating a semiconductor integrated circuit device according to one embodiment of the present invention.

Next, the step after the formation of the element-isolating groove 5 will be described below in brief. First, as shown in FIG. 13, after the silicon nitride film 3 is removed from the substrate 1 using hot phosphorous acid and the silicon oxide film 2 under the silicon nitride film 3 is removed using hydrofluoric acid, the substrate 1 is heat-oxidized at a temperature of about 800–1000° C. to form a thin film of silicon oxide 10 with a thickness of 10 nm on the surface of the active region.

Figure 14:
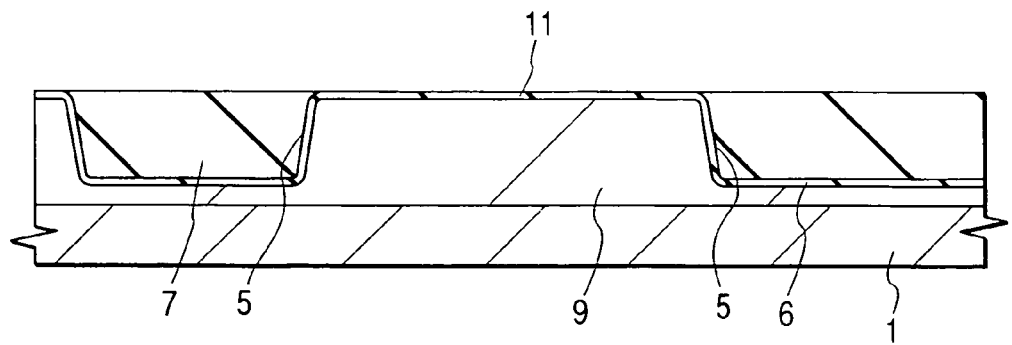
FIG. 14 is a sectional view of the silicon substrate showing a subsequent step in the method of fabricating a semiconductor integrated circuit device according to one embodiment of the present invention.

As shown in FIG. 14, boron (B) is ion-implanted on the substrate 1 through the silicon oxide film 10 to form a p-type well 9, the silicon oxide film 10 is removed using hydrofluoric acid, and then the substrate 1 is heat-oxidized at a temperature of about 800–850° C. to form a clean gate oxide film 11 with a thickness of about 6–8 nm on the surface of the active region.

Figure 15:
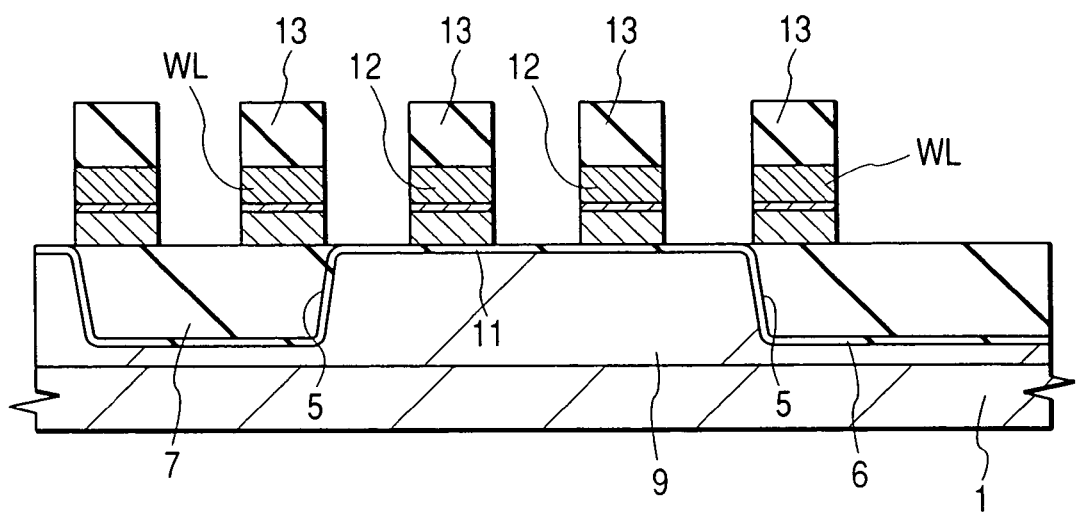
FIG. 15 is a sectional view of the silicon substrate showing a subsequent step in the method of fabricating a semiconductor integrated circuit device according to one embodiment of the present invention.

Next, as shown in FIG. 15, a gate electrode 12 (word line WL) is formed on the gate oxide film 11. The gate electrode 12 (word line WL) is formed by, for example, depositing a polycrystalline silicon film with a thickness of about 50 nm, in which phosphorus (P) is doped, on the gate oxide film 11 by the CVD method, depositing $WSi_2$ (tungsten silicide) with a thickness of about 120 nm by the spattering method on the silicon film surface, depositing a silicon nitride film 13 with a thickness of about 160 nm on the $WSi_2$ surface by the CVD method, and then patterning these films by dry etching using a photo-resist film (not shown) as a mask.

Figure 16:
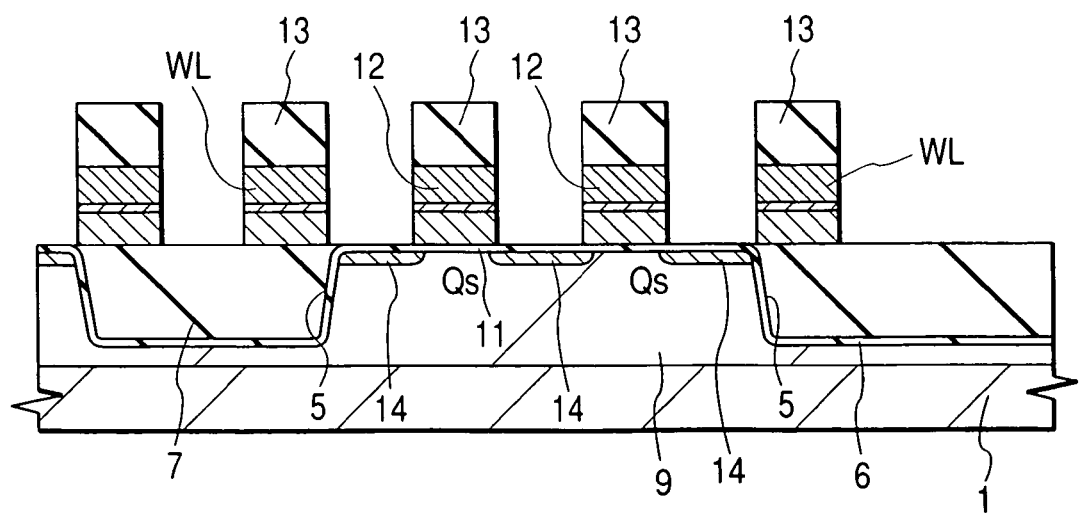
FIG. 16 is a sectional view of the silicon substrate showing a subsequent step in the method of fabricating a semiconductor integrated circuit device according to one embodiment of the present invention.

Next, the surface of the gate oxide film 11 is cleaned with hydrofluoric acid to remove etching waste. Then, as shown in FIG. 16, phosphorus (P) or arsenic (As) is ion implanted in the p-type well 9 to form a n-type semiconductor region 14 (source, drain). In the steps up to this point, a MISFETQs for DRAM memory selection has been almost fabricated.

Figure 17:
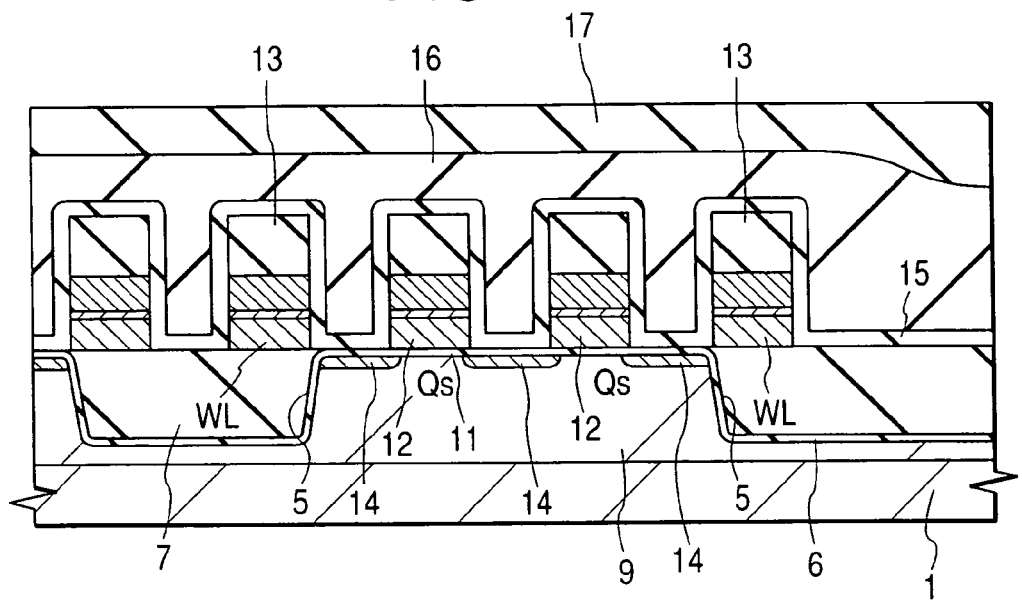
FIG. 17 is a sectional view of the silicon substrate showing a subsequent step in the method of fabricating a semiconductor integrated circuit device according to one embodiment of the present invention.

Next, as shown FIG. 17, after a silicon nitride film 15 is deposited on the substrate 1 by the CVD method and a spin-on glass film 16 is spin-coated on the silicon nitride film 15, the silicon oxide film 17 is deposited on the spin-on glass film 16 by the CVD method.

Figure 18:
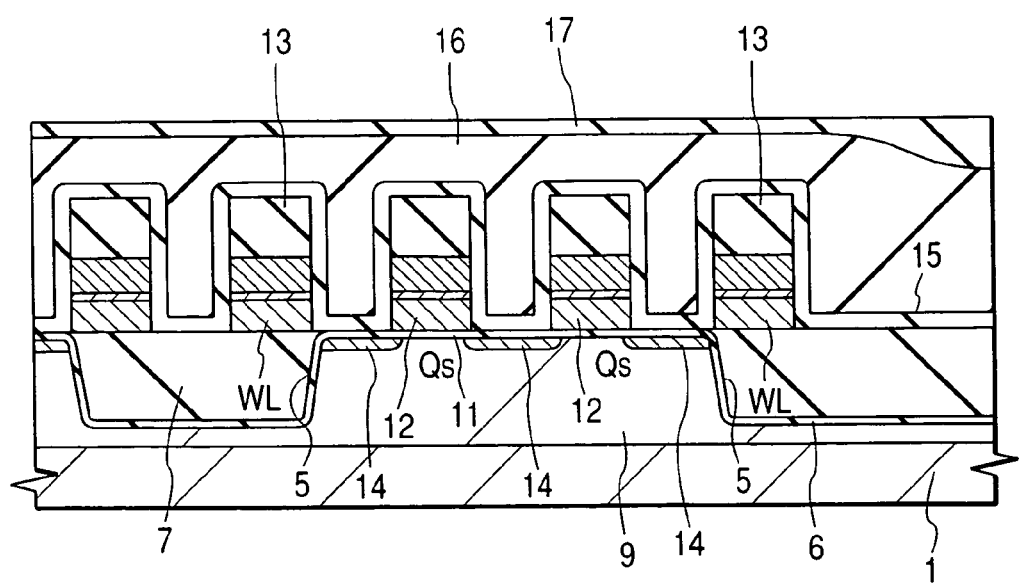
FIG. 18 is a sectional view of the silicon substrate showing a subsequent step in the method of fabricating a semiconductor integrated circuit device according to one embodiment of the present invention.

Next, as shown in FIG. 18, the silicon oxide film 17 is chemically-mechanically polished and its surface is smoothed. In this polishing step, since scratches are increased in size on the spin-on glass film 16 by hydrofluoric cleaning in the next step if micro scratches occur on the silicon oxide film 17 and some of them reach the sub-layer spin-on glass film 16, plugs 20 may be shorted through such scratches when plugs 20 are inserted into contact holes 18 and 19 formed on the spin-on glass film 16 in the later step. Accordingly, in this chemical-mechanical polishing step, the polishing slurry diluted with deionized water is used for polishing, as described earlier.

Figure 19:
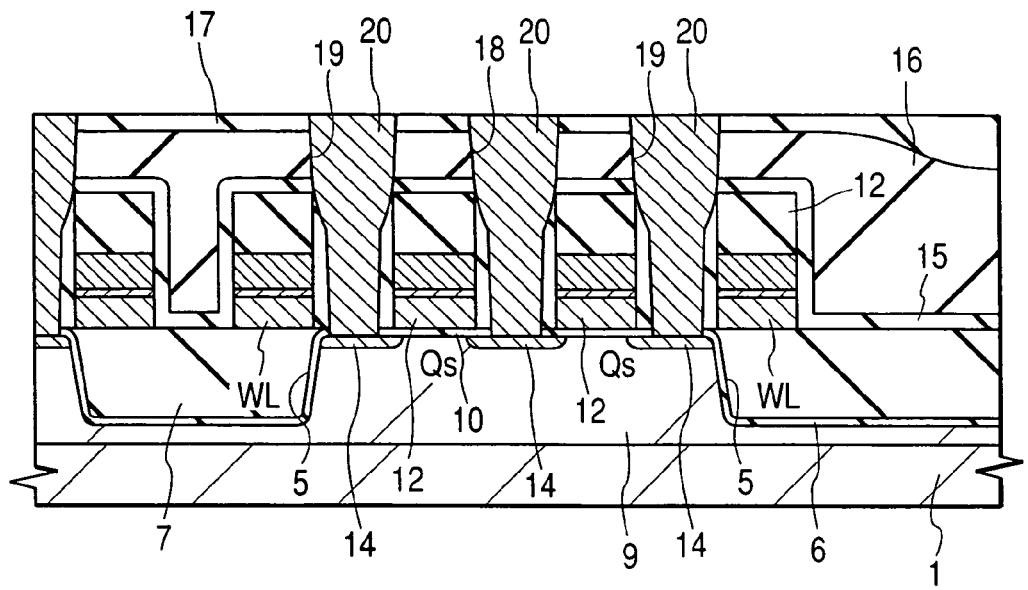
FIG. 19 is a sectional view of the silicon substrate showing a subsequent step in the method of fabricating a semiconductor integrated circuit device according to one embodiment of the present invention.

Next, as shown in FIG. 19, the silicon oxide film 17, the spin-on glass film 16, and the silicon nitride film 15 are dry etched using a photo-resist film (not shown) as a mask to form the contact holes 18 and 19 over the n-type semiconductor region 14 (source, drain). Then, after the insides of the contact holes 18 and 19 are cleaned with hydrofluoric acid, the plugs 20 are formed inside the contact holes 18 and 19. To form the plugs 20, for example, a low-resistance polycrystalline silicon film, in which P was doped, is deposited inside of the contact holes 18, 19 and over the silicon oxide film 17 by the CVD method, and unnecessary portions of the polycrystalline silicon film over the silicon oxide film 17 are removed by dry etching (or chemical-mechanical polishing).

Figure 20:
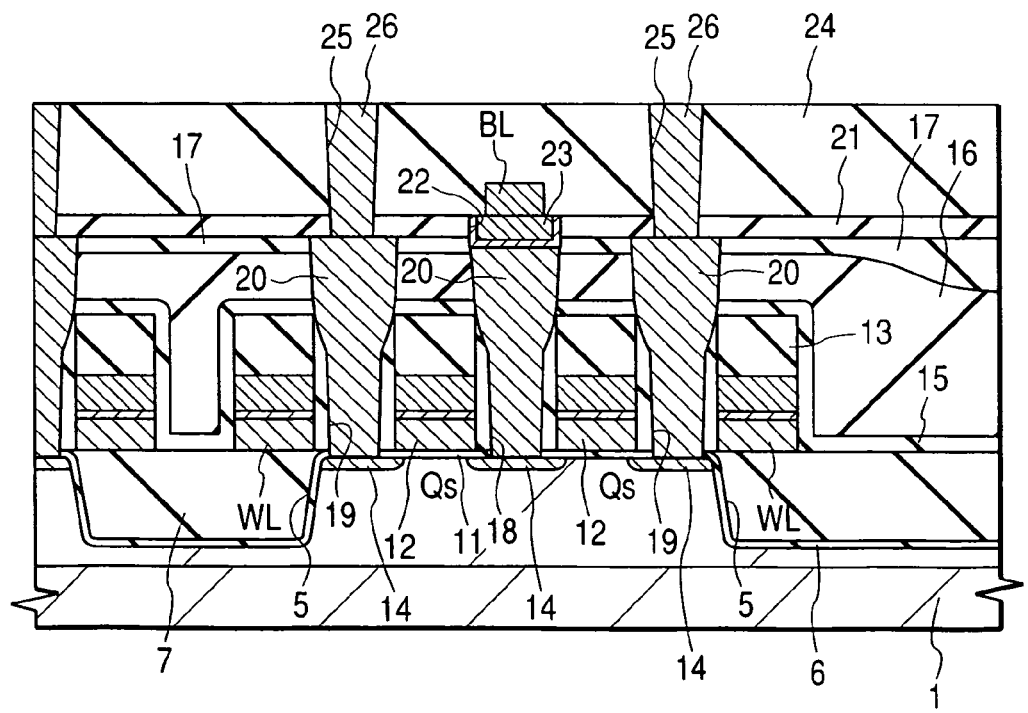
FIG. 20 is a sectional view of the silicon substrate showing a subsequent step in the method of fabricating a semiconductor integrated circuit device according to one embodiment of the present invention.

Next, as shown in FIG. 20, after a silicon oxide film 21 is deposited over the silicon oxide film 17 by the CVD method and the silicon oxide film 21 over the contact holes 18 are etched to form a through hole 22, a plug 23 is formed inside the through hole 22. To form the plug 23, for example, a TiN (titanium nitride) film and a W (tungsten) film are deposited over the silicon oxide film 21 and the unnecessary portions of the TiN film and W film over the silicon oxide film 21 are removed by chemical-mechanical polishing. Consequently, the W film, which is deposited over the silicon oxide film 21 by the spattering method, is patterned to form a bit line BL over the plug 23.

Next, over the bit line BL, a silicon oxide film 24 is deposited by the CVD method, and the silicon oxide film 24 is etched over the contact hole 19 to form a through hole 25. Then, a plug 26 is formed inside the through hole 25. To form the plug 26, for example, a low-resistance polycrystalline silicon film, in which P was doped, is deposited inside the through hole 25 and over the silicon oxide film 24 by the CVD method, and unnecessary portions of the silicon oxide film 24 are removed by dry etching (or chemical-mechanical polishing).

Figure 21:
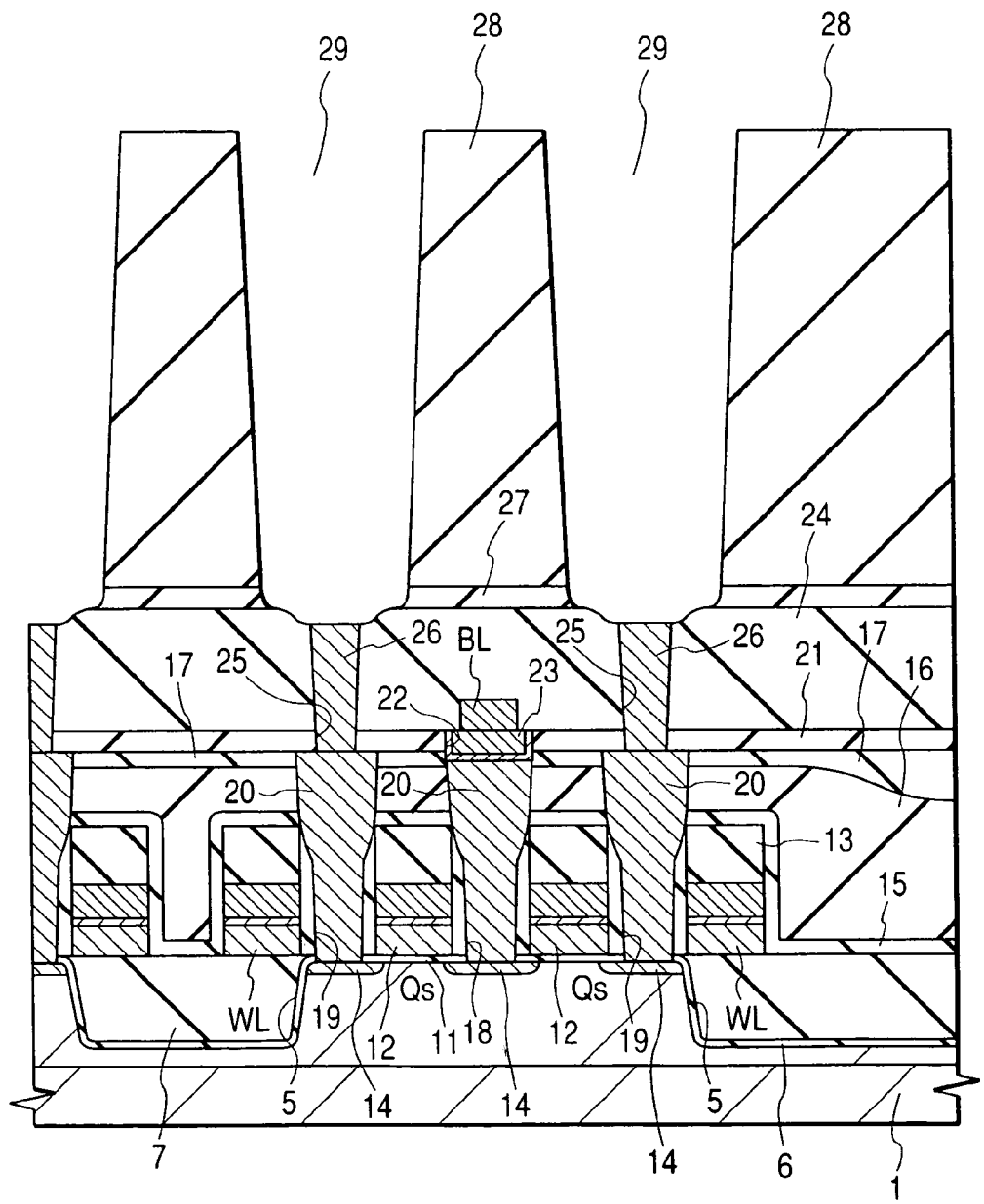
FIG. 21 is a sectional view of the silicon substrate showing a subsequent step in the method of fabricating a semiconductor integrated circuit device according to one embodiment of the present invention.

Next, as shown in FIG. 21, a silicon nitride film 27 is deposited over the silicon oxide film 24 by the CVD method, and a silicon oxide film 28 is deposited over the silicon nitride film 27 by the CVD methods. Then, the silicon oxide film 28 and the silicon nitride film 27 under the film 28 are dry etched using a photo-resist film (not shown) as a mask to form a groove 29 over the through holes 25. A lower electrode 30 of a capacitance element C for information storage, to be described later, is formed along the inner wall of the groove 29. To increase the quantity of built-up charges by enlarging the surface area of the lower electrode 30, it is required that a thick silicon oxide film 28 be deposited.

Figure 22:
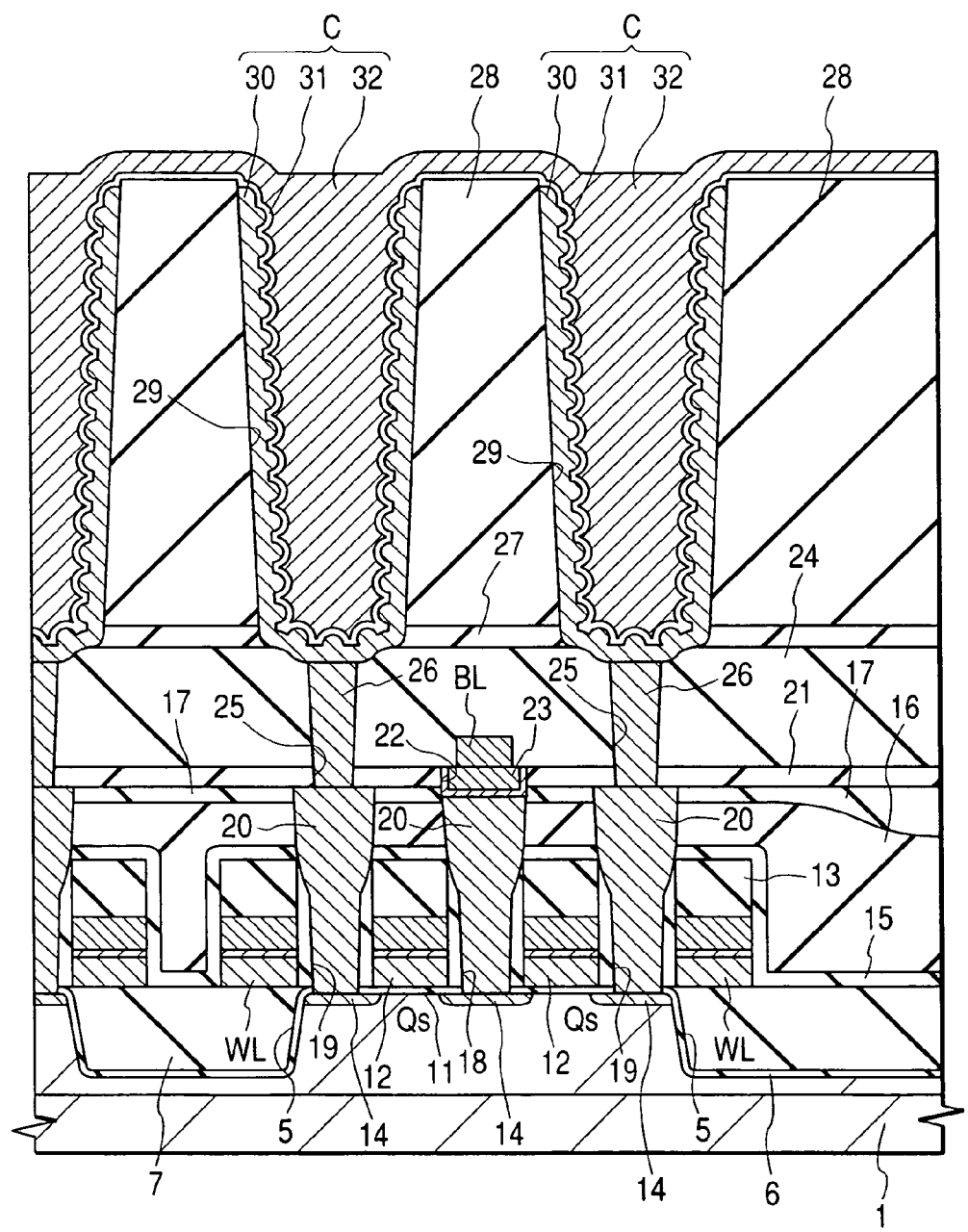
FIG. 22 is a sectional view of the silicon substrate showing a subsequent step in the method of fabricating a semiconductor integrated circuit device according to one embodiment of the present invention.

Next, as shown in FIG. 22, the capacitance element C for information storage, which consists of a lower electrode 30, a capacitance insulating film 31, and an upper electrode 32, is formed inside the groove 29. The lower electrode 30 is made of, for example, the P-doped low-resistance polycrystalline silicon film, and the capacitance insulating film 31 is made of, for example, a tantalum oxide ($Ta_2O_5$) film. In addition, the upper electrode 32 is made of a Tin film. In the steps up to this point, a memory cell, which is composed of the MISFETQs for memory cell selection and the capacitance element C for information storage connected to the MISFETQs in series, has been fabricated.

Thus, the present invention has been especially described based on an exemplary embodiment; however, it goes without saying that the present invention is not limited to the above-mentioned embodiment, and various modifications may be made to it within a range without departing from its intent.

The effects achieved by typical aspects of the invention disclosed in this application are explained below in brief.

Since micro scratches can be reduced by diluting the polishing slurry with deionized water to lower the concentration of coagulated particles immediately before the surface of the wafer is polished using the chemical-mechanical polishing method, the yield and reliability of a semiconductor integrated circuit device can be improved.

What is claimed is:

1. A fabrication method of a semiconductor integrated circuit device, comprising the steps of:
   (a) preparing a polishing slurry;
   (b) diluting said polishing slurry with a water solution, which has deionized water as a main component; and
   (c) supplying diluted polishing slurry over a major surface of a wafer immediately after being diluted with said water solution to apply a chemical-mechanical polishing method,
   wherein said polishing slurry in step (a) is used after it has been left at rest until a concentration of coagulated particles with a diameter of 1 μm or more contained in it becomes 200,000/0.5 cc or less.

2. A fabrication method of a semiconductor integrated circuit device according to claim 1, wherein said polishing slurry in step (a) is used after it has been left at rest until said concentration becomes 50,000/0.5 cc or less.

3. A fabrication method of a semiconductor integrated circuit device according to claim 2, wherein said polishing slurry in step (a) is used after it has been left at rest until said concentration becomes 20,000/0.5 cc or less.

4. A fabrication method of a semiconductor integrated circuit device, comprising the steps of:
   (a) preparing a polishing slurry;
   (b) diluting said polishing slurry with a water solution, which has deionized water as a main component; and
   (c) supplying diluted polishing slurry over a major surface of a wafer immediately after being diluted with said water solution to apply the chemical-mechanical polishing method,
   wherein said polishing slurry in step (a) used after it has been left at rest for 30 days or more.

5. A fabrication method of a semiconductor integrated circuit device according to claim 4, wherein said polishing slurry in step (a) is used after it has been left at rest for 40 days or more.

6. A fabrication method of a semiconductor integrated circuit device according to claim 5, wherein said polishing slurry in step (a) is used after it has been left at rest for 45 days or more.

7. A fabrication method of a semiconductor integrated circuit device, comprising the steps of:
   (a) preparing a polishing slurry containing 11–15 weight % of silica;
   (b) diluting said polishing slurry with a water solution or chemical solution, which has deionized water as a main component; and
   (c) supplying diluted polishing slurry over a major surface of a wafer immediately after being diluted with said water solution or said chemical solution, thereby applying a chemical-mechanical polishing method to form an insulating material filled groove planarized by polishing in the major surface of said wafer,
   wherein a concentration of coagulated silica particles with a diameter of 1 μm or more contained in said polishing slurry in step (a) is 200,000/0.5 cc or less.

8. A fabrication method of a semiconductor integrated circuit device, comprising the steps of:
   (a) preparing a polishing slurry containing 11–15 weight % of silica;
   (b) diluting said polishing slurry with a water solution or chemical solution, which has deionized water as a main component; and
   (c) supplying diluted polishing slurry over a major surface of a wafer immediately after being diluted with said water solution or said chemical solution, thereby applying a chemical-mechanical polishing method to form an insulating material filled groove planarized by polishing in the major surface of said wafer,
wherein said polishing slurry in step (a) has been left at rest for 30 days or more beforehand.

9. A fabrication method of a semiconductor integrated circuit device, comprising the steps of:
(a) forming a groove in a major surface of a wafer by etching the major surface of said wafer using a oxidation-resistant insulating film formed over the major surface of said wafer as a mask;
(b) after step (a), forming a silicon oxide insulating film over the major surface of said wafer including an inside of said groove;
(c) diluting a polishing slurry containing 11–15 weight % of silica with a water solution having deionized water as a main component; and
(d) after step (b), supplying diluted polishing slurry over the major surface of said wafer immediately after being diluted with said water solution, and chemically-mechanically polishing said silicon oxide insulating film using said oxidation-resistant insulating film as a stopper to selectively leave silicon oxide insulating film inside said groove.

10. A fabrication method of a semiconductor integrated circuit device according to claim 9, wherein after said polishing slurry is diluted with said water solution, it is supplied over the major surface of said wafer within two hours.

11. A fabrication method of a semiconductor integrated circuit device according to claim 10, wherein after said polishing slurry is diluted with said water solution, it is supplied over the major surface of said wafer within ten minutes.

12. A fabrication method of a semiconductor integrated circuit device according to claim 11, wherein after said polishing slurry is diluted with said water solution, it is supplied over the major surface of said wafer within 10–15 seconds.

* * * * *